United States Patent
Skrzypczak

(10) Patent No.: US 9,751,169 B2
(45) Date of Patent: Sep. 5, 2017

(54) METHOD FOR DECREASING THE NUMBER OF ASSEMBLY WORKSTATIONS

(71) Applicant: Advanced Digital Broadcast S.A., Chambesy (CH)

(72) Inventor: Maciej Skrzypczak, Zielona Gora (PL)

(73) Assignee: ADVANCED DIGITAL BROADCAST S.A, Chambesy (CH)

( * ) Notice: Subject to any disclaimer, the term of this patent is extended or adjusted under 35 U.S.C. 154(b) by 486 days.

(21) Appl. No.: 14/462,593

(22) Filed: Aug. 19, 2014

(65) Prior Publication Data

US 2015/0052744 A1 Feb. 26, 2015

(30) Foreign Application Priority Data

Aug. 26, 2013 (EP) ..................... 13181643

(51) Int. Cl.
| | |
|---|---|
| *H05K 3/36* | (2006.01) |
| *B23P 21/00* | (2006.01) |
| *G05B 19/418* | (2006.01) |
| *H05K 13/00* | (2006.01) |

(52) U.S. Cl.
CPC ...... *B23P 21/004* (2013.01); *G05B 19/41805* (2013.01); *H05K 13/0061* (2013.01); *Y02P 90/04* (2015.11); *Y02P 90/28* (2015.11); *Y10T 29/49124* (2015.01); *Y10T 29/53187* (2015.01)

(58) Field of Classification Search
CPC ... B23P 21/004; B23K 1/012; H05K 13/0061; G05B 19/41805; Y02P 90/28; Y02P 90/04; Y10T 29/49124; Y10T 29/53187

USPC .............. 29/830–832, 711; 414/806; 483/28
See application file for complete search history.

(56) References Cited

U.S. PATENT DOCUMENTS

| | | | | | |
|---|---|---|---|---|---|
| 4,845,843 | A | * | 7/1989 | Babcock | G01R 31/2808 29/710 |
| 6,634,092 | B1 | * | 10/2003 | Iwasaki | B23K 1/012 29/739 |
| 7,220,222 | B2 | * | 5/2007 | Springston | B29C 31/006 483/28 |

* cited by examiner

*Primary Examiner* — Donghai D Nguyen
(74) *Attorney, Agent, or Firm* — Mark M. Friedman

(57) ABSTRACT

Method for decreasing the number of assembly workstations, comprising: providing a first workstation at a first location, supplied with power from a first source; providing a product to the first workstation and supplying the product with power from the first source; providing a second workstation at a second location, supplied with power from a second source; transporting the product from the first workstation to the second workstation including disconnecting the first source from the product; connecting the product to the second power supply at the second workstation and, before supplying the product with power from the first source, placing the product in a device capable of supplying the product with battery power; disconnecting the first source from the device; and supplying the product with battery power, so that the product remains supplied with power between disconnecting the first source and connecting the product to the second source.

5 Claims, 4 Drawing Sheets

METHOD FOR DECREASING THE NUMBER OF ASSEMBLY WORKSTATIONS

Figure 1:
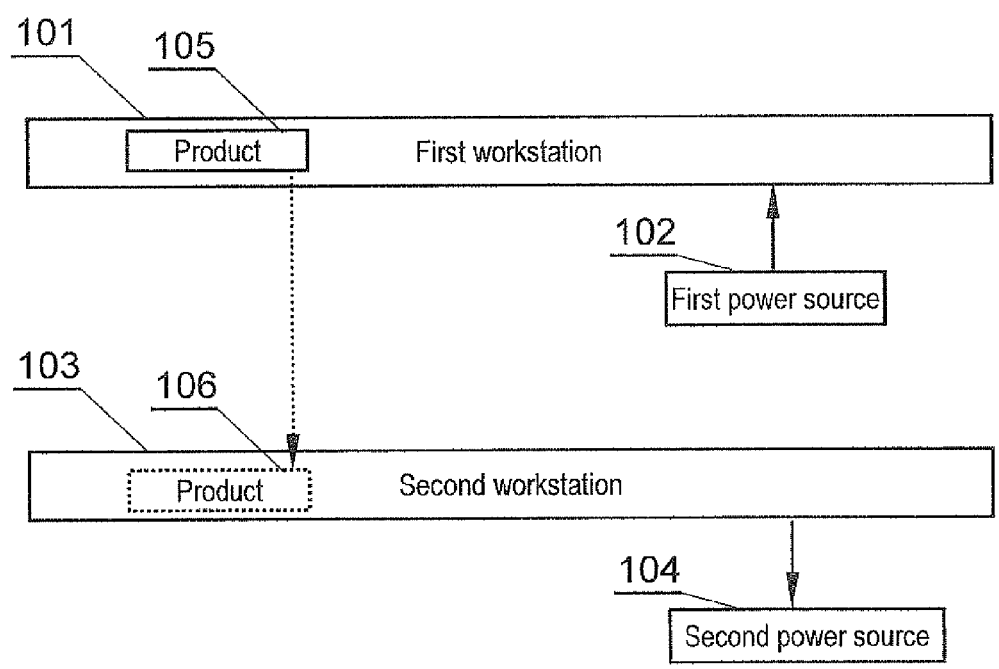

The present invention relates to assembly line system, method and apparatus for decreasing the number of assembly workstations.

Manufacturing of electronic devices having embedded, complex, multilayer software, requires more time than with respect to similar devices in the past when software was simpler.

Typically, after the last stage of the PCB (Printed Circuit Board) assembly (being an SMD (surface-mount device) oven or hand insertion soldering) the device undergoes a series of tests and software downloads to a fresh Flash memory.

Subsequently, various test stages are dedicated to functional verification and quality check of the assembled product. For example, the first test stage is executed in a specific test area, and upon completion of this stage, a device is moved to a next tests area (for example, in another room).

During some of these stages, the PCBA (PCB-Assembly) is inserted into a final chassis and tested during the further stages. During these tests, the product undergoes several to many power off to power on cycles in order to change products location between workstations and for the new software to take control over the device and store required/unique data related for example to a conditional access system.

In order to optimize the production time and effort, the production/assembly line is organized in such that assembled devices being ready for software download are handled in parallel on more than one test bench (a workstation), meaning more than one operator is doing similar task in parallel.

Splitting the production and test into more than one line is the solution for reducing the production bottleneck, however increases the overall production cost, which is a problem. Typically however, there are different test stages utilizing a plurality of workstations operating in parallel.

It would be thus desirable to provide method and apparatus for decreasing the number of assembly workstations that increases production costs.

The object of the present invention is a method for decreasing the number of assembly workstations, the method comprising the steps of providing a first workstation at a first location, supplied with power from a first power source; providing a product to the first workstation and supplying the product with power from the first power source; providing a second workstation at a second location, supplied with power from a second power source; transporting a product from the first workstation to the second workstation including disconnecting the first power source from the product in order to transport the product; connecting the product to the second power supply at the second workstation; the method further comprising the steps of: prior to supplying the product with power from the first power source placing the product in a device capable of supplying the product with power from a battery; disconnecting the first power source from the device; supplying the product from the battery, so that the product remains supplied with power between the disconnecting the first power source and connecting the product to the second power source.

Preferably there is a plurality of second workstations at the second location.

Favorably, the method further includes a step of rebooting the product before the transporting step.

Preferably, the step of rebooting is executed such that the product reaches the second workstation with the booting stage complete.

Preferably, the method further comprises a step of charging an internal battery while the device is connected to the first power source or the second power source.

Another object of the present invention is a device for decreasing the number of assembly workstations, the device comprising: a battery pack; a frame, for carrying a product; a connection configured to supply power from the battery pack to the product; a reboot switch configured to initiate reboot process of the product placed in the device.

Preferably, the device further comprising a charger configured to charge the battery pack while the device is connected to the first power source or the second power source.

Preferably, the frame is adjustable in order to hold products of different dimensions.

Preferably, the product is devoid of an internal power source.

Figure 2A:
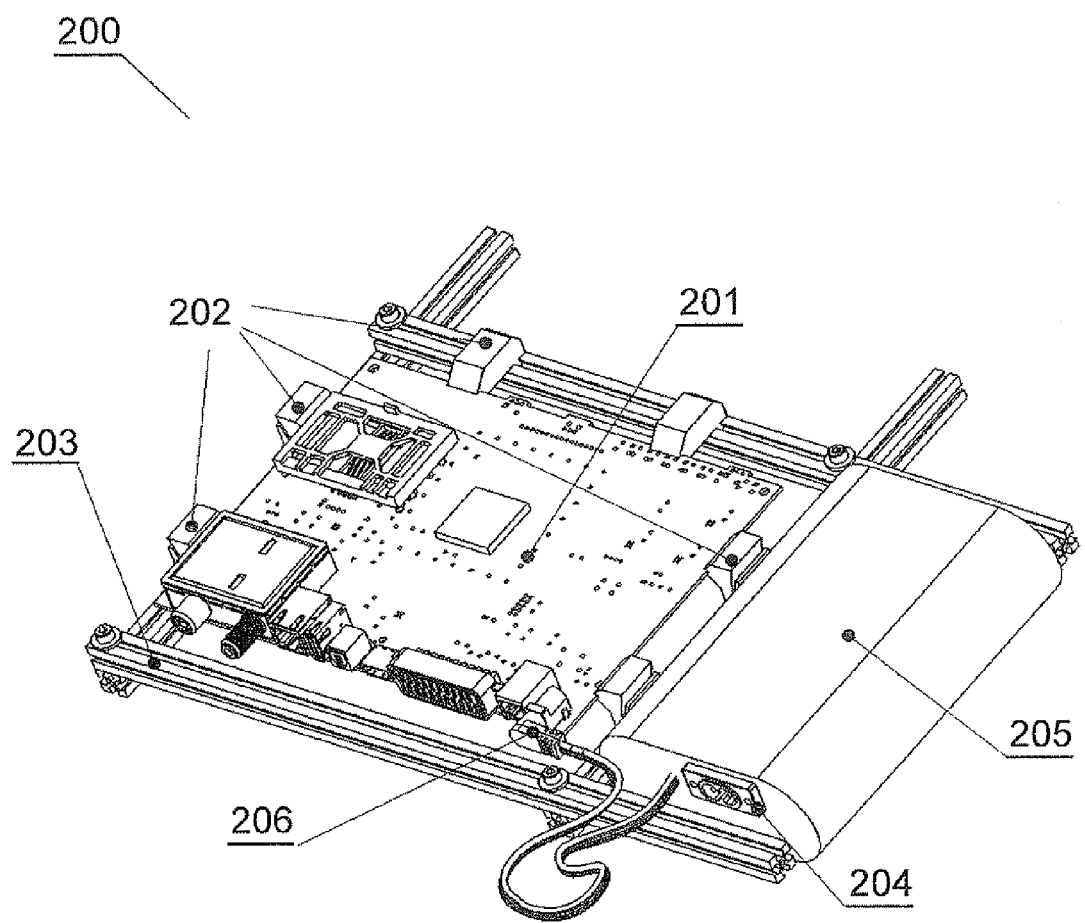
Figure 2B:
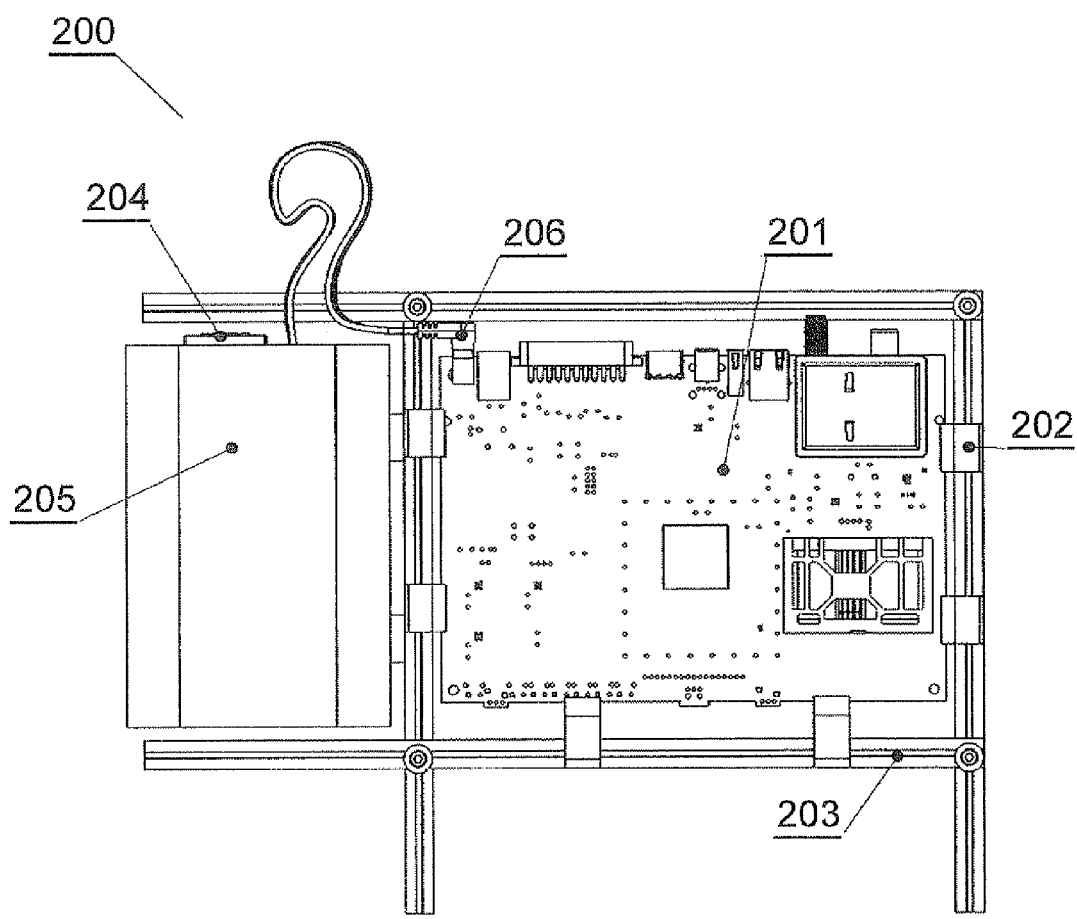
Figure 3:
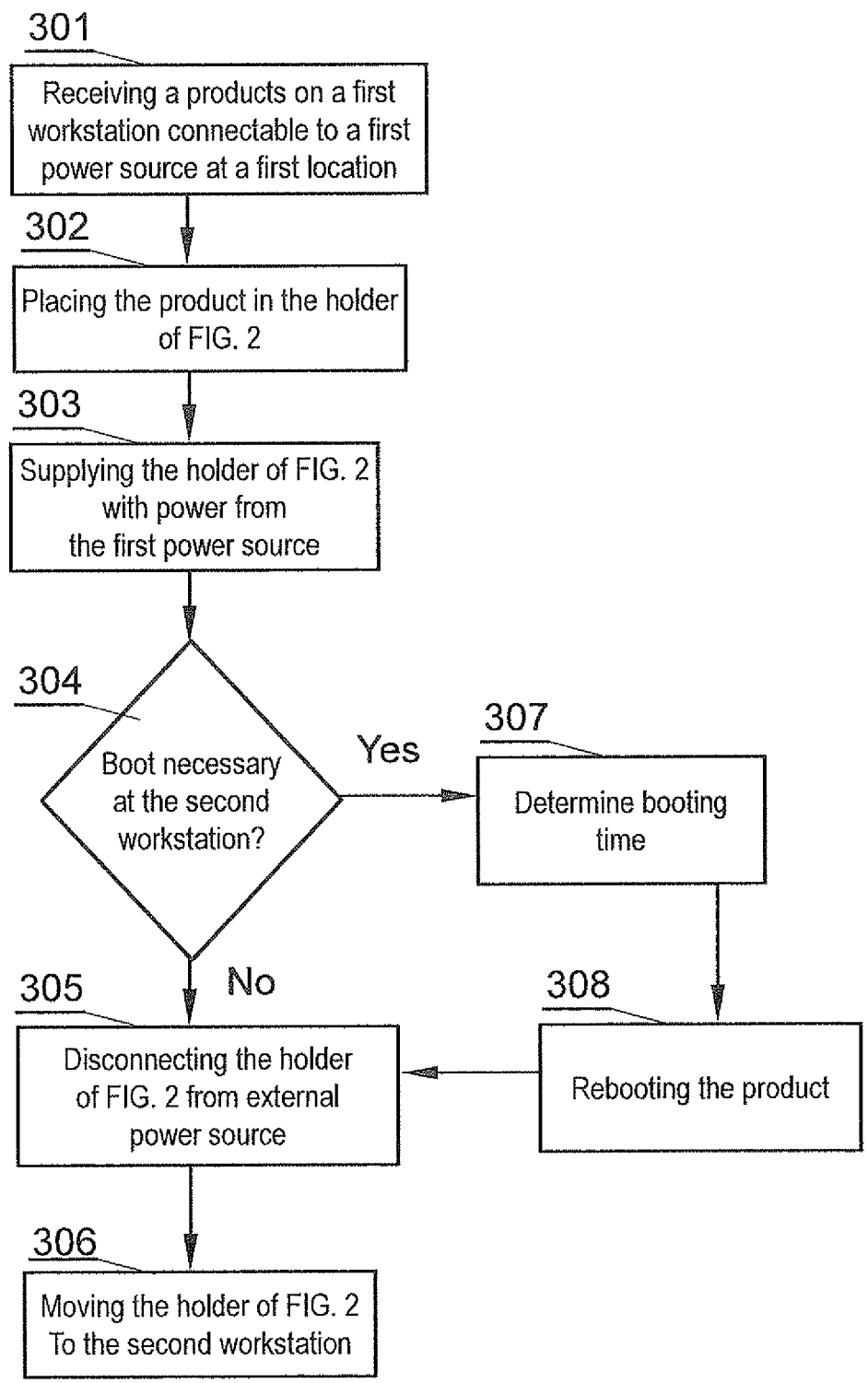

The present invention is shown by means of exemplary embodiments on a drawing, in which:

FIG. 1 presents a schematic diagram of an assembly line comprising two distinct workstations;

FIG. 2A presents a first view of a device according to the present invention;

FIG. 2B presents a second view of a device according to the present invention; and FIG. 3 shows a method for decreasing the number of assembly workstations using the device of FIG. 2.

The origin of the problem with increasing number of workstations on a production line is caused by long booting time of the powered device on test benches. Frequently the test itself is much shorter that the booting time of the device being manufactured.

The booting time is increasing due to growing complexity of software with many levels and stages, from booter through loader, CA verifier, Linux OS or Android and middleware (like MHP (Multimedia Home Platform) or JVM (Java Virtual Machine)) and user GUI application itself as the final stage. The booting time may be reduced by means of software optimization. However, since not all software is under manufacturer's control it is rarely possible.

FIG. 1 presents a schematic diagram of an assembly line comprising two distinct workstations. A first workstation 101 is connected to a power source at a first location 102 and carries a product 105. At a given time during assembly there is a need to transfer the product 105 to a different, second workstation 103, wherein the second workstation is connected to a power source at a second location 104. When the product 105 is assembled on the first workstation, it may be supplied with power from the power source at a first location 102 and when the product 106 is assembled on the second workstation 103, it may be supplied with power from the power source at a second location 104.

The product 105 does not by design comprise (or in other words is devoid of) an internal power source (for example a battery) i.e. the product 105 is a television set, a set top box, a digital video recorder, a gaming console or similar.

A drawback of this solution is that the product 105 must be switched off before being transferred from the first workstation to the second workstation. Then the product 106 is again powered on and a technician must wait until boot process of the product is complete before further tasks, specific to the given workstation, may be carried out.

FIG. 2A presents a first view (perspective view) of a device 200 according to the present invention. The device is a powered holder comprising a battery pack integrated with electronic circuit 205, a dedicated, preferably adjustable frame 203, which carries the PCBA 201 or a product in final chassis (not shown), an appropriate DC jack 206, which fits a DC socket of the product 105 being assembled (a connection for supplying power from the battery pack 205 to the product 105), and optionally an AC or DC socket 204 to power and charge the holder on test bench or when not used (in other words the device 200 includes a charger for charging the battery pack 205).

The frame may be adjustable in order to fit in, different products having different physical dimensions. Making the frame adjustable will be within routine tasks of a skilled person.

The holder has preferably adjustable clamps 202 for holding the product under processing, replaceable with adjustable clamps for final chassis holding.

Optionally the holder may comprise a boot switch, connected with the product 105, configured to initiate reboot process of the product 105.

Further, as an option, the device 200 may comprise an external port, connected to the device 200, for connecting an external memory to which the assembled device may write logs obtained during its testing on the assembly line.

FIG. 2B presents a second view (top view) of a device 200 according to the present invention.

FIG. 3 shows a method for decreasing the number of assembly workstations using the device of FIG. 2A and FIG. 2B.

The new process is designed to avoid assembly line bottleneck caused by long reboot times of complex software. Since most of the time is wasted on device booting on the operator workstation (sometimes referred to as a test bench), instead of reducing the booting time, the new process is based on reducing the time of the device stays on a conveyor belt while not booted.

That means, the device after software download stage is put into a holder, which keeps the device running in order to reduce the number of booting operations from one stage to another. The device may remain in the holder for the complete software download and testing period, which is organized on different physical workstations.

This process reduces the number of parallel test stands, since there is no more waiting for software to boot on the desk as it comes already booted and running ready for testing. Different holder variants are used for PCBA and for final enclosure holding.

There may be two use cases identified. The first case occurs when the product 105 is not powered on at the first workstation 101 and must be powered on at the second workstation 103. In such case the product 105 may be put in the holder of FIG. 2 and powered on sufficiently ahead, in order to arrive, at the second workstation 103, fully operational, thereby reducing assembly time.

The second case is when the product 105 is powered on at the first workstation 101 and must be powered on at the second workstation 103. In such case the product 105 may remain powered on due to use of the holder in order to arrive at the second workstation 103 fully operational without the need for booting, thereby reducing assembly time.

Referring to FIG. 3, the process starts at step 301 where there is executed an action of receiving a product on a first workstation 101 connectable to a first power source 102 at a first location. The product 105, 201 is placed 302 in the holder of FIG. 2 and at step 303 the holder and the device are supplied with power from the first power source 102, which at such an arrangement may charge the battery of the holder. From this moment on i.e. step 302, a disconnection from the first power source 102 will not result in power off for the product 105, 201 as it will be supplied with power from the battery 205.

Subsequently, at step 304, it is verified whether a boot will be necessary before arriving at the second workstation 103.

In case reboot is not necessary, at step 304. Next, at step 305, there is executed an action of disconnecting the holder of FIG. 2 from external power source 102 and subsequently, at step 306, the holder, with the product 105, is moved to the second workstation 103 while being constantly supplied with power from the internal battery before it may be supplied with power from the second power source 104 of the second workstation 103.

In case reboot is necessary, at step 304, booting time is preferably determined 307 or read from parameters memory (the determining step may be optional and some arbitrary time may be set). In real life cases the booting time will be determined for the first time by some calculation of measurement and then determined by reading a stored reference value.

Next, at step 308, there is executed an action of initiating rebooting of the product. The rebooting is preferably made sufficiently ahead of the product reaching the second workstation 103 so that the product may be fully operational when arriving at the second workstation 103. After step 309 the process returns to step 305 or alternatively directly to 306 as the reboot may be executed during transportation of the product from the first workstation 101 to the second workstation 103.

In another embodiment step 303 may be omitted, for example in case when power supply is not required for the product 105, 201 at the first workstation 101. Consequently step 305 may also be skipped in this particular embodiment. The key aspect is that the product 105, 201 will arrive at the second workstation 103 with the booting operations complete i.e. the booting will happen at the first workstation 101 and/or during moving of the product 105, 201 to the second workstation 103.

The apparatus and method presented herein allow for decreasing the number of workstations on an assembly line, since the complete time to test a device is significantly decreased (due to reduced count of boot sequences) and the same number of products will be tested on fewer workstations.

While the invention presented herein has been depicted, described, and has been defined with reference to particular preferred embodiments, such references and examples of implementation in the foregoing specification do not imply any limitation on the invention. It will, however, be evident that various modifications and changes may be made thereto without departing from the broader scope of the technical concept. The presented preferred embodiments are exemplary only, and are not exhaustive of the scope of the technical concept presented herein.

Accordingly, the scope of protection is not limited to the preferred embodiments described in the specification, but is only limited by the claims that follow.

The invention claimed is:

1. A method for decreasing a number of assembly workstations, the method comprising the steps of:
  providing a first workstation at a first location, supplied with electrical power from a first power source;
  providing a product to the first workstation and supplying the product with power from the first power source;
  providing a second workstation at a second location, supplied with power from a second power source;

transporting the product from the first workstation to the second workstation including disconnecting the first power supply from the product in order to transport the product; and connecting the product to the second power source at the second workstation;

wherein the method further comprises the steps of:

prior to supplying the product with power from the first power source, placing the product in a device capable of supplying the product with power from a battery;

disconnecting the first power source from the device; and supplying the product from the battery, so that the product remains supplied with power between disconnecting the first power source and connecting the product to the second power source.

2. The method according to claim 1, wherein there is a plurality of second workstations at the second location.

3. The method according to claim 1, wherein the method further includes a step of rebooting the product before the transporting step.

4. The method according to claim 3, wherein the step of rebooting is executed such that the product reaches the second workstation with a booting stage complete.

5. The method according to claim 1, wherein it further comprises a step of charging the battery while the device is connected to the first power source or the second power source.

* * * * *